United States Patent
Xie et al.

(10) Patent No.: US 7,834,814 B2
(45) Date of Patent: Nov. 16, 2010

(54) ANTENNA ARRANGEMENT

(75) Inventors: Wanbo Xie, Beijing (CN); Wei He, Beijing (CN); Shu Liu, Beijing (CN); Rong Bang An, Beijing (CN)

(73) Assignee: Nokia Corporation, Espoo (FI)

( * ) Notice: Subject to any disclaimer, the term of this patent is extended or adjusted under 35 U.S.C. 154(b) by 187 days.

(21) Appl. No.: 12/215,262

(22) Filed: Jun. 25, 2008

(65) Prior Publication Data

US 2009/0322623 A1 Dec. 31, 2009

(51) Int. Cl.
*H01Q 9/00* (2006.01)
(52) U.S. Cl. .................................. 343/749; 343/850
(58) Field of Classification Search ............... 343/749, 343/750, 745, 744, 850
See application file for complete search history.

(56) References Cited

U.S. PATENT DOCUMENTS

| | | | |
|---|---|---|---|
| 6,011,518 A | 1/2000 | Yamagishi et al. | 343/713 |
| 6,147,652 A | 11/2000 | Sekine | 343/702 |
| 6,307,525 B1 | 10/2001 | Bateman et al. | 343/853 |
| 6,774,850 B2 | 8/2004 | Chen | 343/700 |
| 6,873,299 B2 * | 3/2005 | Dakeya et al. | 343/745 |
| 2002/0118075 A1 | 8/2002 | Ohwada et al. | 333/32 |
| 2003/0142022 A1 | 7/2003 | Ollikainen et al. | 343/702 |
| 2004/0075614 A1 | 4/2004 | Dakeya et al. | 343/745 |
| 2005/0190107 A1 | 9/2005 | Takagi et al. | 343/702 |
| 2006/0176226 A1 | 8/2006 | Moon et al. | 343/702 |
| 2007/0099589 A1 | 5/2007 | Kawai | 455/269 |
| 2008/0055173 A1 | 3/2008 | Chominski | 343/741 |
| 2008/0252536 A1 | 10/2008 | Anguera et al. | 343/702 |

FOREIGN PATENT DOCUMENTS

| | | |
|---|---|---|
| EP | 0 469 779 A2 | 2/1992 |
| EP | 0 821 429 A2 | 1/1998 |
| EP | 1 720 216 A1 | 11/2006 |

OTHER PUBLICATIONS

Matthae, G.; Young. L.; Jones, E M. T. "Microwave Filters, Impedance-Matching Networks, and Coupling Structures", pp. 681-713.
Wagner, R., "Double Stub Matching", pp. 1-8, Aug. 14, 2007, Retrieve from internet (Sep. 30, 2009) URL:http://cnx.org/content/m1066/latest/, Fig. 1; pp. 1-8.

* cited by examiner

*Primary Examiner*—Hoang V Nguyen
(74) *Attorney, Agent, or Firm*—Harrington & Smith

(57) ABSTRACT

An antenna arrangement for radio communication in a first radio communication band and for communication in a second radio communication band including a multiple-resonance antenna element having a feed for connection to radio frequency circuitry; and a load connected to the feed and comprising a plurality of reactive components including a first reactive component that controls the impedance of the load for the first radio communication band and a second reactive component, separate from the first reactive component, that controls the impedance of the load for the second radio communication band wherein the plurality of reactive components of the load are configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

23 Claims, 3 Drawing Sheets

ANTENNA ARRANGEMENT

FIELD OF THE INVENTION

Embodiments of the present invention relate to an antenna arrangement. In particular, they relate to a low-profile antenna arrangement.

BACKGROUND TO THE INVENTION

It is generally desirable to make radio frequency technology more compact so that the devices carrying the technology can be made smaller or so that the technology can be integrated into devices that at present do not include the technology.

One problem associated with radio frequency technology is that at least one antenna element is required to be able to transmit radio frequency signals and/or to receive radio frequency signals. It is a difficult problem to design a radio frequency antenna element that has an acceptable efficiency in a frequency band of interest and which is also of a small size.

Performance of an antenna element is dependent upon the size of the antenna element as there is generally a relationship between the physical size of the antenna element and it's electrical length and also a relationship between the electrical length of the antenna element and it's resonant modes.

Furthermore, the size of a separation of an antenna element from other conducting components such as a ground plane or Printed Wiring Board can dramatically affect the performance of an antenna element. An antenna element may therefore need to be separated from a Printed Wiring Board by some distance to achieve acceptable performance. This places a constraint on the minimum size of a device that can house the antenna element and Printed Wiring Board.

Some antenna elements are required to operate in more than one band. For example, a cellular communication device may need to operate in one band at one time and a different band at a different time. It is a difficult problem to design a multi-band radio frequency antenna element that has an acceptable efficiency in a frequency band of interest and is also of a small size.

Definitions

A 'microwave circuit component' is defined as a class of components that includes lumped reactive components (e.g. capacitors and inductors) and distributed reactive components (e.g. transmission lines) but excludes antennas. Microwave circuit components do not produce effective far-field radiation.

BRIEF DESCRIPTION OF THE INVENTION

According to some, but not necessarily all, examples of the invention there is provided an antenna arrangement for radio communication in a first radio communication band and for communication in a second radio communication band comprising: a multiple-resonance antenna element having a feed for connection to radio frequency circuitry; and an antenna load comprising a plurality of reactive components including a first reactive component that controls the impedance of the load for the first radio communication band and a second reactive component, separate from the first reactive component, that controls the impedance of the load for the second radio communication band wherein the plurality of reactive components of the load are configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

The first reactive component may control the impedance of the load for the first radio communication band to a significantly greater extent than the impedance of the load for the second radio communication band.

The first reactive component may be a microwave circuit component selected from the group comprising: a lumped inductor, a lumped capacitor and a transmission line.

The second reactive component may control the impedance of the load for the second radio communication band to a significantly greater extent than the impedance of the load for the first radio communication band.

The second reactive component may be a microwave circuit component selected from the group comprising: a lumped inductor, a lumped capacitor and a transmission line.

The antenna load may comprise only microwave circuit components.

The antenna load may comprise a first resonant circuit and a second resonant circuit and the first reactive component may control the first resonant circuit and the second reactive component may control the second resonant circuit. The second reactive component may not be a component in the first resonant circuit and the first reactive component may not be a component in the second resonant circuit.

The first reactive component may be a first inductor and the second reactive component may be a second inductor connected in parallel to the first inductor. The first inductor may be connected in parallel with a capacitor and the second inductor may be connected in series with the same or a different capacitor.

The antenna load may comprise a capacitor. The antenna load may comprise two inductors and two capacitors.

The first radio communication band may cover the US-GSM850 band and the EGSM 900 band and the second radio communication band may cover one or more of the following mobile cellular telecommunication bands: PCN/DCS1800, US-WCDMA1900, PCS1900, WCDMA2100.

An impedance of the antenna element and an impedance of the antenna load may have a phase difference of approximately π/2 radians at the first radio communication band and also at the second radio communication band.

According to some, but not necessarily all, examples of the invention there is provided a method comprising: using a multiple-resonance antenna element having a feed connected to radio frequency circuitry; and compensating for a frequency dependent reactance of the antenna element by providing a parallel frequency dependent impedance load that comprises a plurality of reactive components including a first reactive component selected to control the impedance of the load for a first radio communication band and a second reactive component, separate from the first reactive component, that is selected to control the impedance of the load for a second radio communication band wherein the plurality of reactive components of the load are configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

According to some, but not necessarily all, examples of the invention there is provided an apparatus comprising: radio transmission means; and loading means for loading the radio transmission means, wherein the loading means comprises a plurality of reactive components including a first reactive component that controls the impedance of the load for the first radio communication band and a second reactive component, separate from the first reactive component, that controls the impedance of the load for the second radio communication band wherein the plurality of reactive components of the load are configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

According to some, but not necessarily all, examples of the invention there is provided an antenna arrangement for radio communication in a first radio communication band and for communication in a second radio communication band comprising: an antenna element having a feed for connection to radio frequency circuitry; and a load connected to the feed and comprising a plurality of reactive components including a first reactive component that controls a first resonance of the load to fall within the first radio communication band and a second reactive component, separate from the first reactive component, that controls a second resonance of the load to fall within the second radio communication band.

The first reactive component may be a component in a parallel LC resonant circuit and the second reactive component may be a component in a series RLC resonant circuit. The second reactive component need not be a component in the parallel LC circuit and the first reactive component need not be a component in the series RLC resonant circuit.

According to some, but not necessarily all, examples of the invention there is provided an antenna arrangement for radio communication in a first radio communication band and for communication in a second radio communication band comprising: an antenna element having a feed for connection to radio frequency circuitry; and a compact antenna load comprising a compact configuration of reactive components adjacent the antenna element that provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

According to some, but not necessarily all, examples of the invention there is provided an antenna arrangement for radio communication in a first radio communication band and for communication in a second radio communication band comprising: an antenna element having a feed for connection to radio frequency circuitry; and a load connected to the feed and comprising a capacitor, an inductor and one or more additional reactive components wherein the components of the load are configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

According to some, but not necessarily all, examples of the invention there is provided an antenna arrangement for radio communication in a first radio communication band and for communication in a second radio communication band comprising: an antenna element having a feed for connection to radio frequency circuitry; and an antenna load comprising a plurality of reactive components, including a capacitor, that define a first resonant circuit and a second resonant circuit, wherein the first resonant circuit has a resonance at a frequency within the first radio communication band and the second resonant circuit has a resonance at a frequency within the second radio communication band.

According to some, but not necessarily all, examples of the invention there is provided an antenna arrangement for radio communication in a first radio communication band and for communication in a second radio communication band comprising: a multiple-resonance antenna element having a feed for connection to radio frequency circuitry; and an antenna load comprising only microwave circuit components configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

This provides the advantage that the antenna arrangement can have a wider bandwidth and higher efficiency with lower profile.

There is freedom to tune the antenna arrangement's impedance.

BRIEF DESCRIPTION OF THE DRAWINGS

For a better understanding of the present invention reference will now be made by way of example only to the accompanying drawings in which.

DETAILED DESCRIPTION OF EMBODIMENTS OF THE INVENTION

Figure 1:
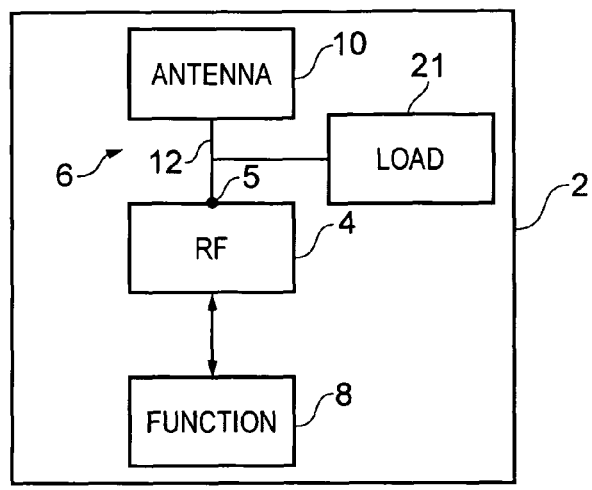
FIG. 1 schematically illustrates an apparatus that is suitable for radio communications.

FIG. 1 schematically illustrates an apparatus 2 that is suitable for radio communications using radio frequency (RF) technology. The apparatus 2 in this example, comprises functional circuitry 8 which provides data to RF circuitry 4 and/or receives data from RF circuitry 4 and an antenna arrangement 6 connected to the RF circuitry 4. The antenna arrangement 6 includes an antenna element 10 and a load 21.

The apparatus 2 may be any suitable device such as network equipment or portable electronic devices like a mobile terminal in a cellular communications network or, a hand-portable device such as a mobile cellular telephone, personal digital assistant, gaming device, music player, personal computer, that enables the device to communicate using RF technology.

Although in the following paragraphs, the RF technology is described in relation to a mobile cellular terminal for use in a cellular communications network, embodiments of the invention may find application in other RF networks such as local ad-hoc RF networks, infrastructure networks etc.

The RF circuitry 4 has an output 5 that is connected to a feed 12 of the antenna element 10. If the RF circuitry 4 is capable of transmitting, then the output 5 is typically connected to a power amplifier within the RF circuitry 4.

The load 21 is connected to the feed 12 of the antenna element 10 as a shunt network. The load 21 is located close to the antenna element 10. The purpose of the load 21 is to modify the operational bandwidths of the antenna 10. Operational bandwidth is a frequency range over which an antenna can efficiently operate. Efficient operation occurs, for example, when the antenna's return loss S11 is greater than an operational threshold such as 4 dB or 6 dB. The load 21 is a frequency dependent load that changes from being predominantly capacitive to being predominantly inductive with changing frequency.

The antenna 10 may be used to transmit RF signals provided by the RF circuitry 4 and/or receive RF signals that are provided to the RF circuitry 4. The antenna 10 is a multiple-resonance antenna. In this example, it has multiple operational bandwidths coinciding with each of the multiple resonances.

Figures 2, 3:
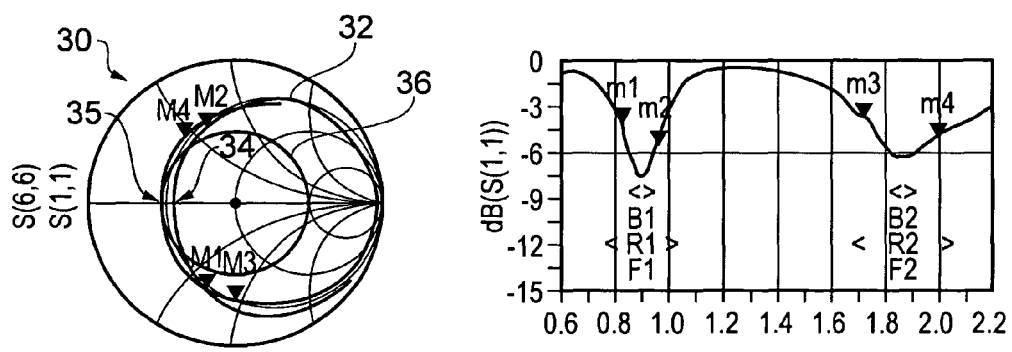
FIG. 2 illustrates a Smith Chart for one example of a multiple-resonance antenna.
FIG. 3 plots the return loss S11 of the multiple resonance antenna.

A Smith Chart for one example of the antenna 10 is illustrated in FIG. 2. In the Smith Chart 30 the complex impedance 32 of the antenna 10 is plotted. The impedance plot is real valued at point 34 corresponding to resonant frequency F1 and at point 35 corresponding to resonant frequency F2.

Also plotted on the Smith Chart 30 is a locus 36 for a fixed voltage standing wave ratio (VSWR). This locus 36 is a circle centered on the characteristic impedance and it defines operational bandwidths for the antenna 10. If the impedance of the antenna 10 at a particular frequency falls on or inside the locus 36 then the antenna is sufficiently matched to the characteristic impedance to enable efficient operation of the antenna at that frequency. If the impedance of the antenna 10 at a particular frequency falls outside the locus 36 then the antenna is insufficiently matched to the characteristic impedance and efficient operation of the antenna at that frequency is not possible. In the illustrated example, the locus 36 is defined by VSWR=3. The bandwidth of an antenna is the range of frequencies for which the antenna's complex impedance lies within the locus 36.

The return loss S11 of the antenna 10 is plotted in FIG. 3. This illustrates the bandwidth B1 about the resonant frequency F1 and the bandwidth B2 about the resonant frequency F2.

Markers m1 and m2 are used to illustrate the respective lower and upper frequency limits of a first radio communications band R1 (which may be a group of radio communication bands). Markers m3 and m4 are used to illustrate the respective lower and upper frequency limits of a second radio communications band R2 (which may be a group of radio communication bands). It can be seen from FIGS. 2 and 3 that the antenna 10 by itself without the load 21 is not operational across the whole of the first radio communication band R1 or the second radio communication band R2.

The impedances of the antenna 10 at frequencies m1 and m3 (frequencies below the resonant frequencies F1 and F2) are capacitive. The impedances of the antenna 10 at frequencies m2 and m4 (frequencies above the resonant frequencies F1 and F2) are inductive.

The load 21 is used to broaden the bandwidths B1 and B2.

Figure 4:
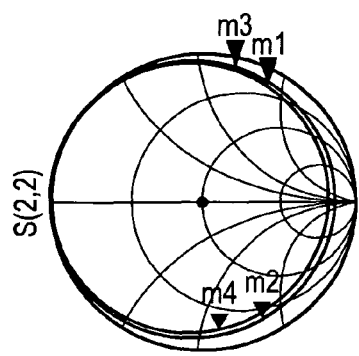
FIG. 4 illustrates a Smith Chart for one example of an antenna load.

FIG. 4 illustrates a Smith Chart 40 for one example of a load 21.

The impedances of the load 21 at frequencies m1 and m3 (frequencies below the resonant frequencies F1 and F2 respectively) are offset by a phase change of approximately $\pi/2$ radians from the impedances of the antenna 10 at the same frequencies m1 and m3.

The impedances of the load 21 at frequencies m2 and m4 (frequencies above the resonant frequencies F1 and F2 respectively) are offset by a phase change of approximately $\pi/2$ radians from the impedances of the antenna 10 at the same frequencies m2 and m4.

Referring to FIG. 4, the impedances of the load 21 at frequencies m1 and m3 (frequencies below the resonant frequencies F1 and F2) are inductive. The impedances of the load 21 at frequencies m2 and m4 (frequencies above the resonant frequencies F1 and F2) are capacitive.

As frequency increases, the impedance of the load 21 changes from being inductive at frequency m1 to being real valued at a frequency intermediate of m1 and m2 to being capacitive at frequency m2. The resonant frequency F1 of the antenna lies between m1 and m2.

As the frequency increases further, the impedance of the load 21 changes from being inductive at frequency m3 to being real valued at a frequency intermediate of m3 and m4 to being capacitive at frequency m4. The resonant frequency F2 of the antenna 10 lies between m3 and m4.

The load 21 illustrated by FIG. 4 consequently comprises at least two resonant circuits. A first resonant circuit dominates at the lower frequencies m1 to m2 and tuning the resonant frequency of the first resonant circuit controls the impedance values at m1 and m2. A second resonant circuit dominates at the higher frequencies m3 to m4 and tuning the resonant frequency of the second resonant circuit controls the impedance values at m3 and m4.

Figure 5:
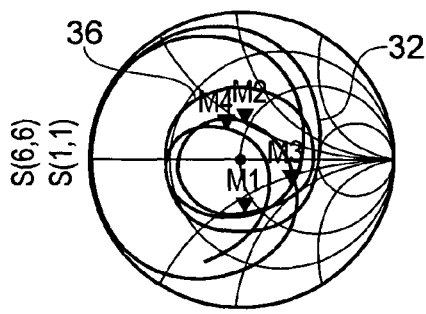
FIG. 5 illustrates a Smith Chart for the antenna when shunted by the antenna load.

FIG. 5 illustrates a Smith Chart 50 for the antenna arrangement 6 i.e. the combination of antenna 10 and load 21.

The load 21 operates as a matching circuit and enables better matching of the impedance of the antenna element 10 to the characteristic impedance.

Figure 6:
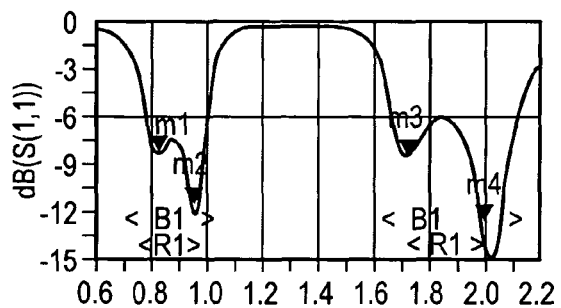
FIG. 6 plots the return loss S11 of the antenna when shunted by the antenna load.

Between m1 and m2, the impedance of the antenna arrangement 6 is closer than the impedance of the antenna element itself to the characteristic impedance and the impedance of the antenna arrangement 6 falls within the locus 36 as illustrated in FIG. 6.

Between m3 and m4, the impedance of the antenna arrangement 6 is closer than the impedance of the antenna element itself to the characteristic impedance and the impedance of the antenna arrangement 6 falls within the locus 36 as illustrated in FIG. 6.

A schematic illustration of the return loss S11 of the antenna arrangement 6 is illustrated in FIG. 6. It can be seen that the bandwidth B1 at lower frequencies is greater than the first radio communication band R1 and that the the bandwidth B2 at higher frequencies is greater than the second radio communication band R2.

The antenna arrangement 6 in this example is a dual resonance structure with a broad bandwidth B1 at low band that covers the US-GSM850 band (824-894 MHz) and the EGSM 900 band (880-960 MHZ). It also has a wide bandwidth B2 at higher frequencies covering for example one or more of the following mobile cellular telecommunication bands: PCN/DCS1800 (1710-1880 MHZ), US-WCDMA1900 (1850-1990 MHZ), PCS1900 (1850-1990 MHZ). In other implementations it may also or alternatively cover the WCDMA2100 band (TX-1920-1980, RX-2110-2180).

Figure 7:
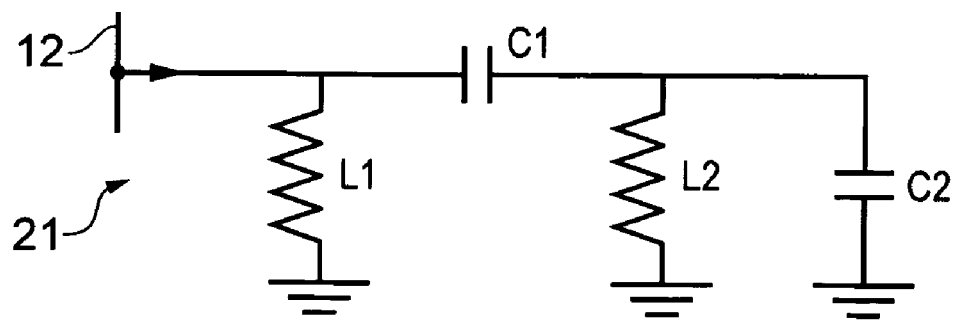
FIG. 7 illustrates one example of an antenna load.

FIG. 7 illustrates one example of a load 21. In this implementation the load 21 comprises only microwave circuit components (defined term). The microwave circuit components comprise a plurality of reactances including parallel inductance L1, a series capacitance C1, a parallel inductance L2 and a parallel capacitance C2. The inductance L2 is in parallel with the circuit formed by capacitance C2, inductor L2 and capacitor C2. The capacitance C1 is in series with the parallel circuit formed by the inductance L2 and the capacitance C2. There will also inevitably be some small series resistance.

The inductance L1 and capacitance C1 form part of a parallel LC resonant circuit. The inductance L2 and capacitance C2 form a parallel LC resonant circuit. The series combination of capacitance C1 and inductance L2 with the inherent resistance form a series RLC resonant circuit.

There is a reactance in the parallel LC resonant circuit (the inductance L1) that is not part of the series RLC resonant circuit. This reactance may be provided by a lumped component. Varying the value of this lumped component varies the resonant frequency of a parallel resonant LC circuit significantly without significantly varying the series RLC circuit.

There is a reactance in the series RLC resonant circuit (the inductance L2) that is not part of the parallel LC resonant circuit. This reactance may be provided by a lumped component. Varying the value of this lumped component varies significantly the resonant frequency of a series RLC resonant circuit without significantly varying the parallel LC circuit.

The distinct and separate components for the inductance L1 and the inductance L2 provide control of the impedance of the load 21 in the frequency range m1 to m2 and in the frequency range m3 to m4.

The inductances and capacitances may be provided only by lumped components where each of the inductance L1, L2 is provided by a different inductor and each of the capacitances C1, C2 is provided by a different capacitor. It may also be possible to use a transmission line to provide combinations of capacitance and inductance. The transmission line may be a short length substantially lossless transmission line with a resistance of less than 5 Ohm and with a length less than 10 mm or 20 mm. The exact configuration of components may be varied.

Figure 8:
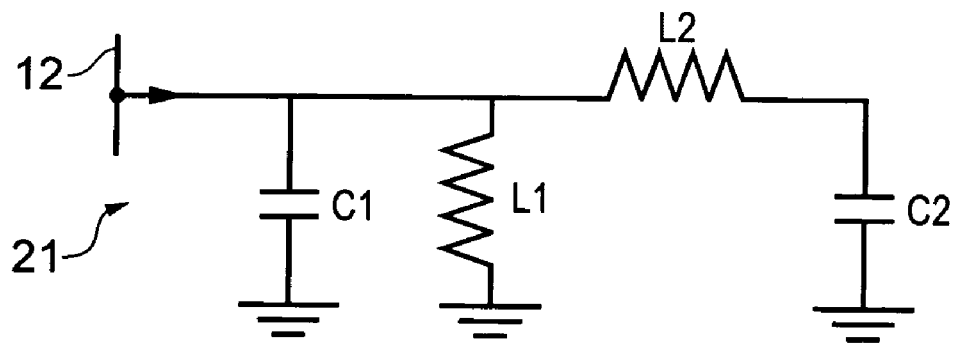
FIG. 8 illustrates another example of an antenna load.

FIG. 8 illustrates another example of a load 21. In this implementation the load 21 comprises only microwave circuit components (defined term). The microwave circuit components comprise a plurality of reactances including parallel capacitance C1, parallel inductance L1, and series inductance L2 and capacitance C2. There will also inevitably be some small series resistance. The capacitance C1 is in parallel with the inductance L1. The capacitance C2 is in series with the inductance L2 and the combination of capacitance C2 and inductance L2 is in parallel with the inductance L1. There will also inevitably be some small series resistance.

The inductance L1 and capacitance C1 form a parallel LC resonant circuit. The inductance L2 and capacitance C2 and the inherent resistance form a series RLC resonant circuit.

There is a reactance in the parallel LC resonant circuit (e.g. the inductance L1) that is not part of the series RLC resonant circuit. This reactance may be provided by a lumped component. Varying the value of this lumped component significantly varies the resonant frequency of a parallel resonant LC circuit without significantly varying the series RLC circuit.

There is a reactance in the series RLC resonant circuit (e.g. the inductance L2) that is not part of the parallel LC resonant circuit. This reactance may be provided by a lumped component. Varying the value of this lumped component significantly varies the resonant frequency of a series RLC resonant circuit without significantly varying the parallel LC circuit.

The distinct and separate components for the inductance L1 and the inductance L2, in this example, provide control of the impedance of the load 21 in the frequency range m1 to m2 and in the frequency range m3 to m4.

The inductances and capacitances may be provided only by lumped components where each of the inductance L1, L2 is provided by a different inductor and each of the capacitances C1, C2 is provided by a different capacitor. It may also be possible to use a transmission line to provide the combination of inductance and capacitance. The transmission line may be a short length substantially lossless transmission line with a resistance of less than 5 Ohm and with a length less than 10 mm or 20 mm.

The loads 21 in FIGS. 7 and 8 both have at least a first reactive component that controls the impedance of the load 21 in the frequency range m1 to m2 and a second reactive component that controls the impedance of the load 21 in the frequency range m3 to m4. The first reactive component significantly controls the impedance of the load 21 in the frequency range m1 to m2 without significantly affecting the impedance of the load 21 in the frequency range m3 to m4. The second reactive component significantly controls the impedance of the load 21 in the frequency range m3 to m4 without significantly affecting the impedance of the load 21 in the frequency range m1 to m2.

The load 21 may be created from a compact configuration of microwave circuit components (defined term) that are all situated close to the antenna element 10. Compact in this sense means that if transmission lines are used that they are short length. In the illustrated example, the antenna element 10 and the load 21 are distinct and are separated by at most a small distance of less than 20 mm.

Although embodiments of the present invention have been described in the preceding paragraphs with reference to various examples, it should be appreciated that modifications to the examples given can be made without departing from the scope of the invention as claimed.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An antenna arrangement for radio communication in a first radio communication band and for communication in a second radio communication band comprising:
    a multiple-resonance antenna element having a feed for connection to radio frequency circuitry; and
    an antenna load connected to the feed of the antenna element as a shunt network and comprising a plurality of reactive components including a first reactive component that controls the impedance of the antenna load for the first radio communication band and a second reactive component, separate from the first reactive component, that controls the impedance of the antenna load for the second radio communication band wherein the plurality of reactive components of the antenna load are configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

2. An antenna arrangement as claimed in claim 1, wherein the first reactive component controls the impedance of the antenna load for the first radio communication band to a significantly greater extent than the impedance of the antenna load for the second radio communication band.

3. An antenna arrangement as claimed in claim 1, wherein the antenna load only comprises microwave circuit components and the first reactive component is selected from the group comprising: a lumped inductor, a lumped capacitor and a short length line.

4. An antenna arrangement as claimed in claim 1, wherein the second reactive component controls the impedance of the antenna load for the second radio communication band to a significantly greater extent than the impedance of the antenna load for the first radio communication band.

5. An antenna arrangement as claimed in claim 1, wherein the antenna load only comprises microwave circuit components and the second reactive component is selected from the group comprising: a lumped inductor, a lumped capacitor and a short length line.

6. An antenna arrangement as claimed in claim 1, wherein the antenna load comprises a first resonant circuit and a second resonant circuit and the first reactive component controls the first resonant circuit and the second reactive component controls the second resonant circuit.

7. An antenna arrangement as claimed in claim 6, wherein the second reactive component is not a component in the first resonant circuit and the first reactive component is not a component in the second resonant circuit.

8. An antenna arrangement as claimed in claim 1, wherein the first reactive component is a first inductor and the second reactive component is a second inductor connected in parallel to the first inductor.

9. An antenna arrangement as claimed in claim 8, wherein the first inductor is connected in parallel with a capacitor and the second inductor is connected in series with a capacitor.

10. An antenna arrangement as claimed in claim 1, wherein the antenna load comprises a capacitor.

11. An antenna arrangement as claimed in claim 1, wherein the antenna load comprises two inductors and two capacitors.

12. An antenna arrangement as claimed in claim 1, wherein the first radio communication band covers the US-GSM850 band and the EGSM 900 band and the second radio communication band one or more of the following mobile cellular telecommunication bands: PCN/DCS1800, US-WCDMA1900, PCS1900, WCDMA2100.

13. An antenna arrangement as claimed in claim 1, wherein an impedance of the antenna element and an impedance of the antenna load have a phase difference of approximately $\pi/2$ at the first radio communication band and at the second radio communication band.

14. A method comprising:
using a multiple-resonance antenna element having a feed connected to radio frequency circuitry; and
compensating for a frequency dependent reactance of the antenna element by providing a parallel frequency dependent impedance load connected to the feed of the antenna element as a shunt network and that comprises a plurality of reactive components including a first reactive component selected to control the impedance of the load for a first radio communication band and a second reactive component, separate from the first reactive component, that is selected to control the impedance of the load for a second radio communication band wherein the plurality of reactive components of the load are configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

15. An apparatus comprising:
multiple-resonance radio transmission means;
a feed for coupling radio frequency circuitry to the radio transmission means; and
loading means for loading the radio transmission means, wherein the loading means is connected to the feed as a shunt network and comprises a plurality of reactive components including a first reactive component that controls the impedance of the load for the first radio communication band and a second reactive component, separate from the first reactive component, that controls the impedance of the load for the second radio communication band wherein the plurality of reactive components of the load are configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

16. An antenna arrangement for radio communication in a first radio communication band and for communication in a second radio communication band comprising:
a multiple-resonance antenna element having a feed for connection to radio frequency circuitry; and
a load connected to the feed as a shunt network and comprising a plurality of reactive components including a first reactive component that controls a first resonance of the load to fall within the first radio communication band and a second reactive component, separate from the first reactive component, that controls a second resonance of the load to fall within the second radio communication band.

17. An antenna arrangement as claimed in claim 16, wherein the first reactive component is a component in a parallel LC resonant circuit and the second reactive component is a component in a series RLC resonant circuit.

18. An antenna arrangement as claimed in claim 17, wherein the second reactive component is not a component in the parallel LC circuit and the first reactive component is not a component in the series RLC resonant circuit.

19. An antenna arrangement for radio communication in a first radio communication band and for communication in a second radio communication band comprising:
a multiple-resonance antenna element having a feed for connection to radio frequency circuitry; and
a compact antenna load connected to the feed as a shunt network and comprising a compact configuration of reactive components adjacent the antenna element that provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

20. An antenna arrangement for radio communication in a first radio communication band and for communication in a second radio communication band comprising:
a multiple-resonance antenna element having a feed for connection to radio frequency circuitry; and a load connected to the feed as a shunt network and comprising a capacitor, an inductor and one or more additional reactive components wherein the components of the load are configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

21. An antenna arrangement for radio communication in a first radio communication band and for communication in a second radio communication band comprising:

a multiple-resonance antenna element having a feed for connection to radio frequency circuitry; and an antenna load connected to the feed as a shunt network and comprising a plurality of reactive components, including a capacitor, that define a first resonant circuit and a second resonant circuit, wherein the first resonant circuit has a resonance at a frequency within the first radio communication band and the second resonant circuit has a resonance at a frequency within the second radio communication band.

22. An antenna arrangement for radio communication in a first radio communication band and for communication in a second radio communication band comprising:

a multiple-resonance antenna element having a feed for connection to radio frequency circuitry; and an antenna load connected to the feed as a shunt network and comprising only microwave circuit components configured to provide an impedance that changes between being inductive at a first frequency in the first radio communication band to being capacitive at a second frequency in the first radio communication band and that changes between being inductive at a third frequency in the second radio communication band to being capacitive at a fourth frequency in the second radio communication band.

23. A portable electronic device comprising the antenna arrangement according to claim 1.

* * * * *